United States Patent
Neuman et al.

(10) Patent No.: US 9,781,839 B1
(45) Date of Patent: Oct. 3, 2017

(54) ATTACHING WIRE TO A LAYER OF ADHESIVE

(71) Applicant: AUTOMATED ASSEMBLY CORPORATION, Lakeville, MN (US)

(72) Inventors: David Neuman, Randolph, MN (US); Robert Neuman, Cannon Falls, MN (US); Pat Connolly, Burnsville, MN (US); Brian Backes, Lakeville, MN (US)

(73) Assignee: Automated Assembly Corporation, Lakeville, MN (US)

( * ) Notice: Subject to any disclaimer, the term of this patent is extended or adjusted under 35 U.S.C. 154(b) by 169 days.

(21) Appl. No.: 14/883,302

(22) Filed: Oct. 14, 2015

(51) Int. Cl.
*H05K 3/10* (2006.01)
*H05K 3/32* (2006.01)

(52) U.S. Cl.
CPC .............. *H05K 3/321* (2013.01); *H05K 3/10* (2013.01)

(58) Field of Classification Search
CPC .......... H05K 3/321; H05K 3/32; H05K 3/103; H05K 3/10; H05K 2201/10098; H05K 2201/10106; H05K 1/028; H05K 1/032; H05K 2201/10287; H05K 13/06; H05K 3/222; H01Q 1/2208; F21Y 2115/10
See application file for complete search history.

(56) References Cited

U.S. PATENT DOCUMENTS

2001/0011413 A1* 8/2001 Yamaguchi ...... G06K 19/07749
29/600

* cited by examiner

*Primary Examiner* — Vishal I Patel
(74) *Attorney, Agent, or Firm* — Crawford Maunu PLLC

(57) ABSTRACT

A method of attaching wire to an exposed surface of an adhesive layer includes guiding wire from a wire source through a payout head and through a foot of a write head. A first portion of the wire extends from the foot toward the adhesive layer. The write head is positioned such that a gap between the foot and the exposed surface of the adhesive layer is greater than a diameter of the wire. The write head is moved in a motion parallel to the adhesive layer, and the first portion of the wire adheres to the adhesive layer. Wire is pulled from the wire source by the payout head as the write head is moving in order to maintain slack in a second portion of the wire between the payout head and the write head as the wire is attached to the exposed surface of the adhesive layer.

11 Claims, 10 Drawing Sheets

ATTACHING WIRE TO A LAYER OF ADHESIVE

FIELD OF THE INVENTION

The disclosure describes approaches for attaching a wire to a layer of adhesive.

BACKGROUND

There are a number of applications in which electronics are attached to various articles. The electronics may provide a function that is ancillary to the function of the article or may work in conjunction with the article to provide a desired function. Radio frequency identification (RFID), near-field communication (NFC), and light-emitting diode (LED) lighting are examples of such applications.

RFID applications vary from inventory control to traffic management to pet identification. RFID systems generally include readers and tags. RFID tags are affixed to the articles to be tracked, and the RFID reader emits a signal to activate the RFID tag. The RFID tag may respond by reading data from a memory and emitting a signal with the desired information for the RFID reader. Near-field communication tags are expanding RF applications beyond identification to data gathering applications.

LED-based lighting is becoming more popular due in part to the energy efficient qualities and durability of LEDs. Applications for LED-based lighting may include advertising signage, decorations, or utility and general purpose lighting.

For some applications, LEDs or RFID integrated circuits (ICs) and associated wiring are mounted on a flexible substrate. Prior to mounting the electronic device, wiring patterns may be formed on the substrate using a print-and-etch process. The wiring patterns are laid out to accommodate placement of one or more devices on the substrate at desired locations.

Making RFID tags or LED arrangements on a flexible substrate may be prohibitively expensive for some applications. The expense is attributable in part to the print-and-etch processes used in creating the wiring pattern. Expensive chemicals are required for print-and-etch processes, and hazardous waste is a byproduct.

A method that address these and other related issues are therefore desirable.

SUMMARY

In one embodiment, a method of attaching wire to an exposed surface of an adhesive layer is provided. The method includes guiding wire from a wire source through a payout head and through a foot of a write head. The foot has a surface facing the adhesive layer and a first portion of the wire extending from the foot toward the adhesive layer. The method positions the write head such that a gap between the surface of the foot and the exposed surface of the adhesive layer is greater than a diameter of the wire. The first portion of the wire extends toward the exposed surface of the adhesive layer and contacts a first site of the adhesive layer when positioning is complete. The write head is moved in a motion parallel to the adhesive layer, and the first portion of the wire extending toward the exposed surface of the adhesive layer adheres to the adhesive layer. Wire is pulled from the wire source by the payout head as the write head is moving in order to maintain slack in a second portion of the wire between the payout head and the write head as the wire is attached to the exposed surface of the adhesive layer.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Figure 1:
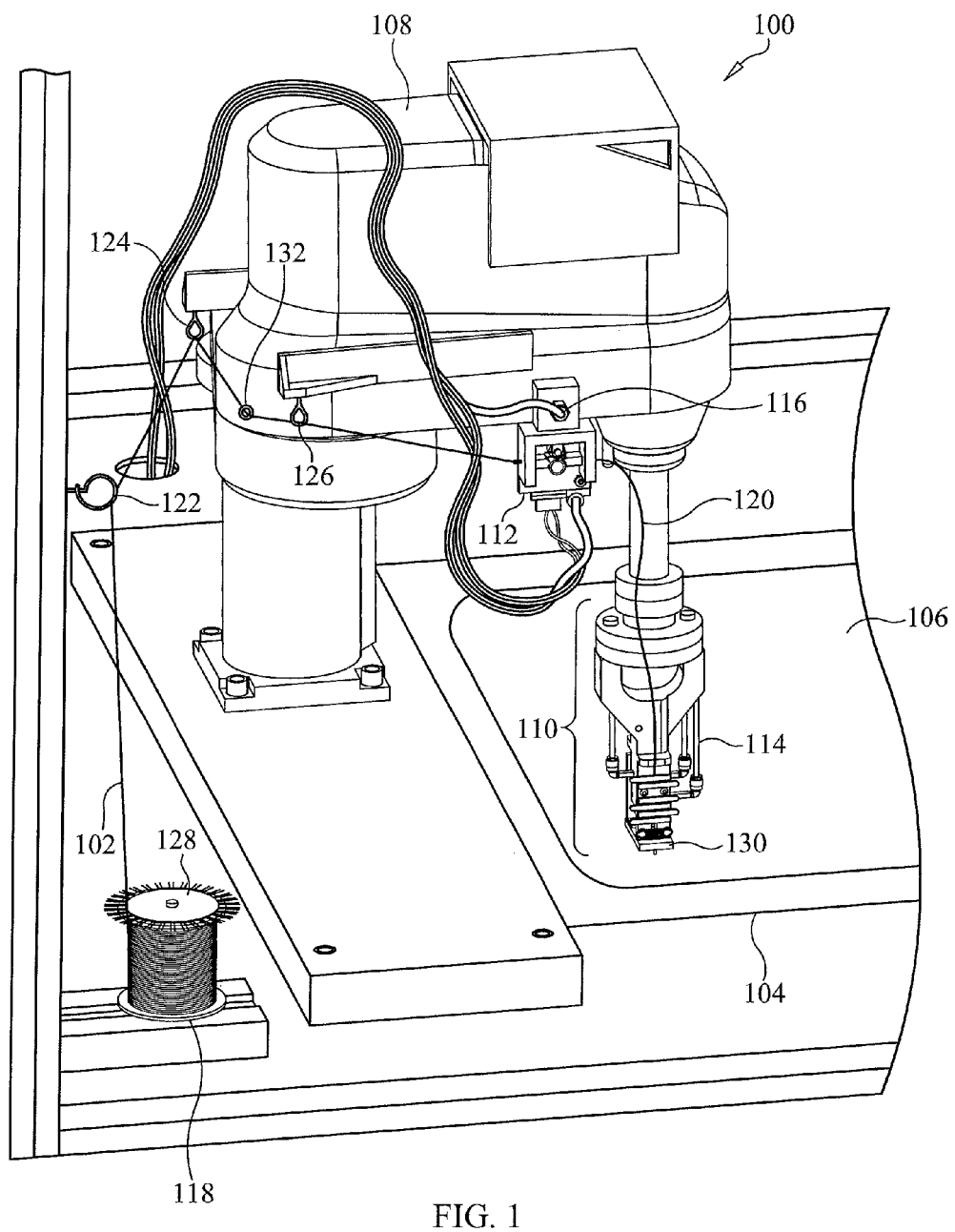
FIG. 1 shows a perspective view of a system for attaching fine-gauge round wire to a substrate.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Terms such as over, under, top, bottom, above, below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

According to the disclosed approaches, wire is attached to an exposed surface of a layer of pressure sensitive adhesive (PSA) by maintaining slack in a portion of the wire and guiding the wire from the slack portion through a robotically controlled write head to contact the PSA. A small gap is maintained between the write head and the PSA while the write head is moved parallel to the PSA. The gap may be slightly larger than the diameter of the wire. As the write head is moved, the wire contacts and adheres to the PSA, pulling the wire through the write head from the slack portion. The slack in the wire and the small gap between the write head and the PSA permits the wire to be drawn through the write head as the wire adheres to the PSA. The method may be used to create precise wiring patterns of very fine gauge wire, for example, 44 gauge (AWG) and smaller.

The disclosed approaches may be used in a variety of applications. In one application, wiring may be laid to construct antennas for radio frequency transponder arrangements, such RFID and Near-field Communication (NFC) tags, including loop, coil, meander, and dipole antenna patterns, for example. In another application, wiring may be laid for power and control of LEDs. The LEDs may be attached to a substrate in any desired pattern, and the power and control wiring may be readily attached to the adhesive layer on the substrate and then connected to the LEDs.

The disclosed approaches provide advantages conventionally associated with print-and-etch wiring without incurring the attendant high costs of using and disposing of environmentally hazardous chemicals. For example, in RF and LED applications, flexible printed circuits are durable, light-weight, and provide a thin profile. However, the conductive traces are formed on a flexible substrate by spraying, sputtering, electrodeposition, or pressing annealed copper foils on the substrate and etching unnecessary copper from the surface.

The disclosed approaches eliminate the need for costly chemicals through the application of bare or jacketed wire directly to the adhesive layer on a substrate. The same substrates used in print and etch applications may be used in the disclosed structures, with very small gauge wire replacing the printed and etched wire patterns. No costly chemicals are used as would be for spraying, sputtering, or electrodeposition. No etching chemicals and no hazardous waste are required as would be for etching copper foil from the substrate.

FIG. 1 shows a perspective view of a system 100 for attaching fine-gauge round wire 102 to a substrate 104. The substrate has a layer of pressure-sensitive adhesive (PSA) 106 for attaching the wire. The system 100 includes a robot 108, such as a 4-axis robot from Denso Robotics, and the robot includes a write head 110, a payout head 112, and pneumatics 114 and 116 for controlling the write head and payout head. Images gathered by a camera (not shown) attached to the write head are used in positioning the write head at desired locations on the substrate.

The payout head 112 draws wire 102 from spool 118 and maintains a slack portion 120 between the payout head and the substrate. The wire is guided from the spool to the payout head by eyehooks 122, 124, and 126. A whisker disk 128 may be attached to the top of the spool to keep a minimal amount of tension and prevent too much slack in the wire between the spool and the payout head 112. The payout head includes a pneumatically controlled nip roller that draws wire from the spool at a rate approximately equal to the rate at which the wire is attached to the PSA 106 and sufficient to maintain slack in the wire in the slack portion 120. As the write head 110 moves parallel to the surface of the PSA, the wire contacts and adheres to the PSA and is drawn through the write head from the slack portion 120.

Maintaining a suitable amount of slack in the slack portion 120 is important to successfully attach the wire to the PSA 106. The slack portion cannot be so large that it would create drag and pull wire away from the PSA when the write head is either stationary or moving, or so large that the wire might catch on parts of the robot. The drag-free slack portion permits the write head to move quickly and guide the fragile, fine-gauge wire to the PSA without risk of breaking.

As there is effectively little or no tension in the wire in the slack portion 120, the motion of the write head and the portion of the wire in contact with the PSA are sufficient to draw the wire from the slack portion and form a wiring pattern on the substrate. The foot 130 of the write head does not contact the PSA 106 to force the wire to attach. Rather, the small gap between the foot of the write head and the PSA creates a small radius bend in the wire, which forces the wire to contact the PSA. The small gap allows detailed patterns of wire to be laid on the layer of PSA. If the gap is too large, the wire might attach but have a tendency to wander from a desired pattern.

The apparatus 100 may lay multiple individual segments (not shown) of wire on the PSA 106. As will be shown further below, at the end of laying a wire segment, the write head clamps the wire, the wire is broken beneath the foot 130, and the write head 110 is moved to a new position to lay the next segment of wire. A small counterweight 132, such as a small nylon washer, may be attached to the wire between the spool 118 and the payout head 112 and used to take up excess wire from the slack portion 120 at end of laying a particular wire pattern. The slack may be re-introduced prior to commencing writing another wire pattern.

Figure 2:
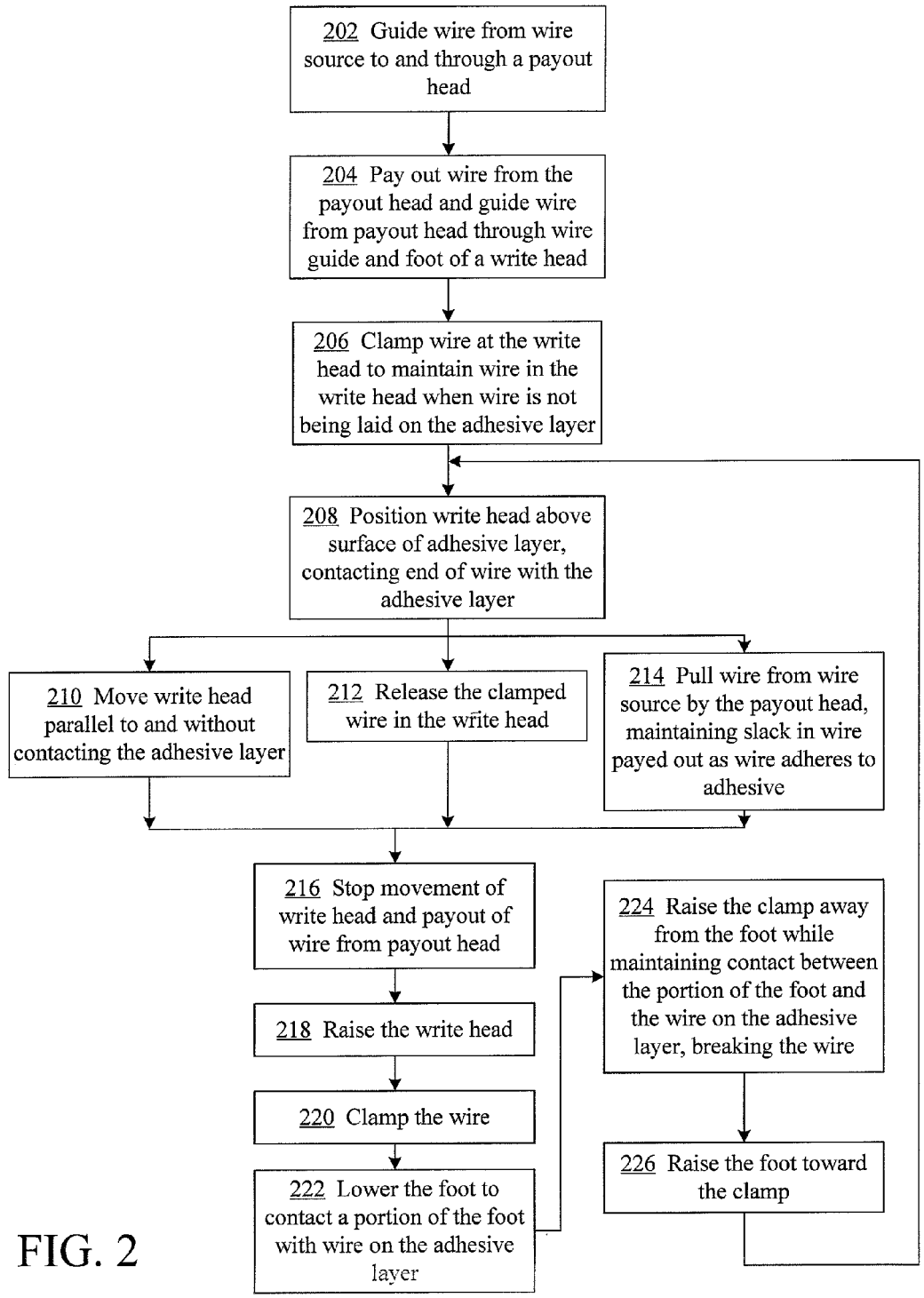
FIG. 2 shows a flowchart of a process for attaching fine-gauge wire to a PSA layer on a substrate.

FIG. 2 shows a flowchart of a process for attaching fine-gauge wire to a PSA layer on a substrate. At block 202, the wire is guided from a wire source, such as a spool, to a payout head. The payout head pays out wire at block 204 at a rate sufficient to maintain a slack portion as wire is drawn from the slack portion and adhered to the PSA layer as the write head moves. The wire is also guided from the payout head to and through wire guides, a releasable clamp, and a foot of the write head. When wire is not being laid on the adhesive layer, the wire is clamped by the write head at block 206 in order to prevent the wire from retracting from the guides of the write head.

At block 208, the write head is positioned above the PSA layer at desired X and Y coordinates of the substrate. The height of the write head above the surface of the PSA layer depends on the desired wiring pattern, wire gauge, and the adhesion properties of the PSA. A smaller gap between the foot of the write head and the PSA is advantageous for wiring patterns having small radius turns. However, if the gap is too small, a too-small radius bend in the wire as the wire exits the foot of the write head may create too much friction for the wire to adhere to the PSA and be drawn through the write head. If the gap is too large, the wire may not adhere to the PSA. A larger gap may be required for larger gauge wires. A more "sticky" PSA, such as a PSA exhibiting a greater force of attraction to the wire, permits a larger gap between the foot of the write head and the surface of the adhesive.

The write head is moved to the desired X and Y coordinate position and to the desired height above the PSA at block 208, and without interrupting movement of the write head once in the desired position, the operations of blocks 210, 212, 214 are performed concurrently to commence laying wire on the PSA. The write head is moved parallel to the surface of the PSA at block 210, while maintaining a desired gap between the foot of the write head and the surface of the PSA. The wire is released by the clamp at block 212, allowing the wire to be pulled from the slack portion as the write head moves and the wire contacts and adheres to the PSA. At block 214, the payout head pulls wire from the wire source and maintains slack in the wire in a drag-free slack portion between the payout head and write head.

Figure 8:
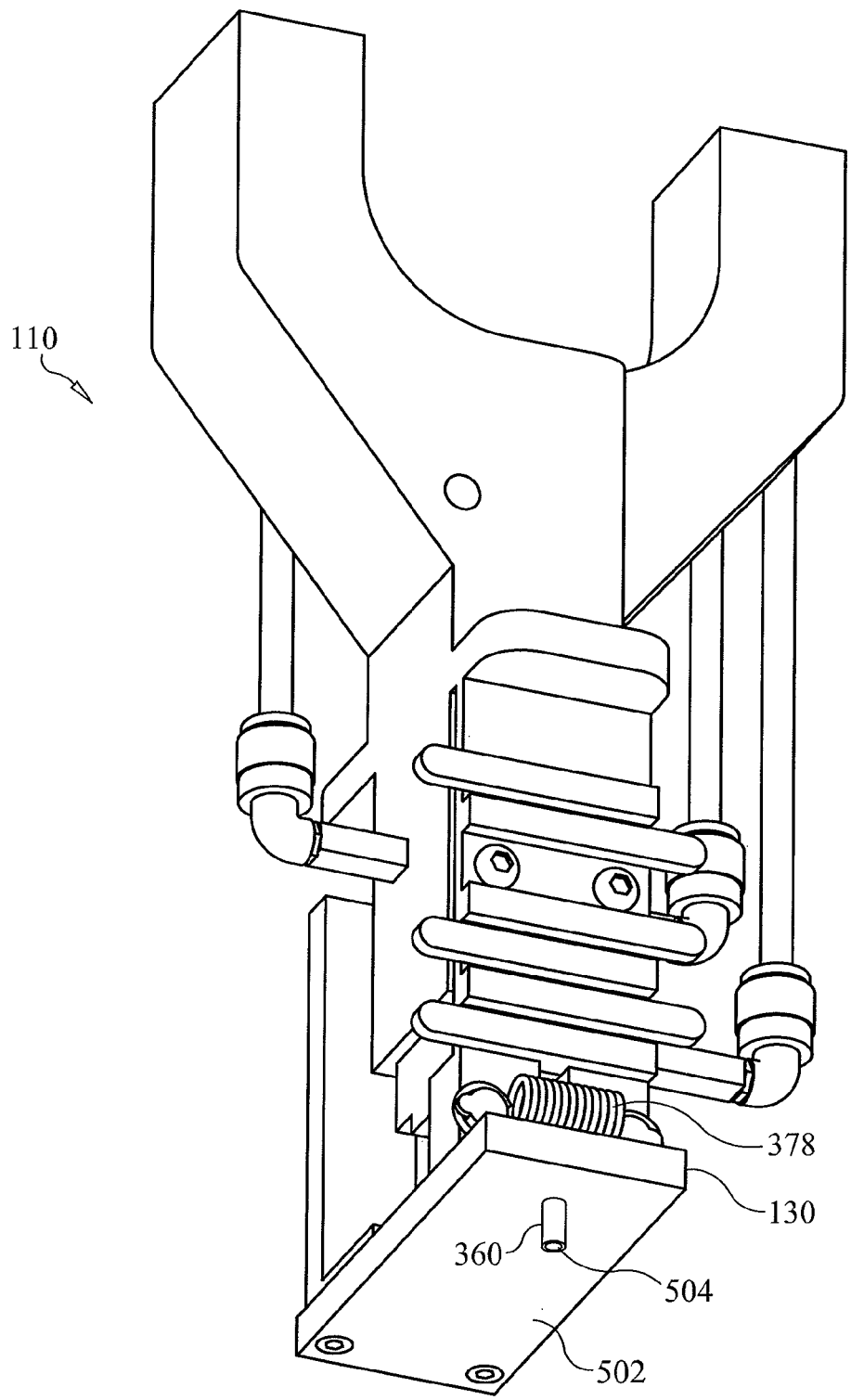
FIG. 8 shows a bottom perspective view of the write head.
Figure 9:
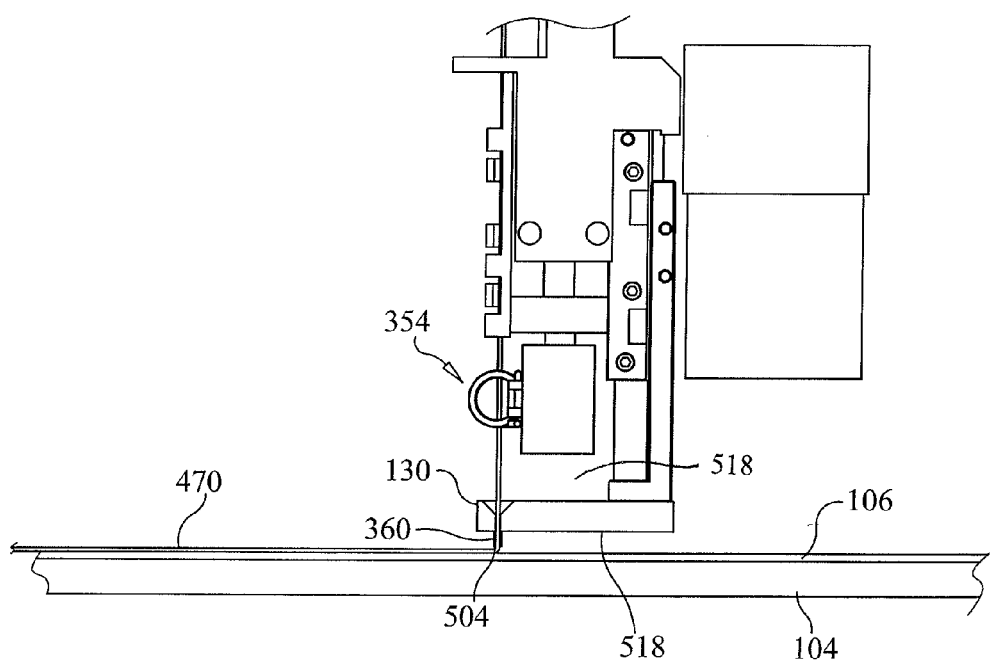
FIG. 9 shows a partial side view of the write head and the position of the write head relative to the PSA layer after raising the write head and lowering the foot.

When the wiring pattern is complete, at block 216 movement of the write head is stopped and payout of wire from the payout head is stopped. At block 218, the write head is raised, increasing the gap between the foot of the write head and the surface of the PSA by approximately 1 mm. After the write head is raised, the wire is clamped in the write head at block 220. After clamping the wire, at block 222 the foot of the write head is lowered toward the surface of the PSA and a portion of the foot contacts the wire on the PSA. The clamp of the write head is not lowered toward the PSA. As shown in FIGS. 8 and 9 and described further below, the portion of the foot that contacts the wire on the PSA layer is a sleeve that extends from a major surface of the foot and through which the wire passes.

At block 224, the clamp of the write head is raised away from the foot of the write head while maintaining contact between the portion of the foot and a portion of the wire on PSA layer. Raising the write head while the wire is clamped and the portion of the foot contacts the wire on the PSA layer causes the wire to break.

The foot is raised toward the clamp of the write head at block 226. Returning the foot to nearer the clamp pushes the wire through the foot such that a small segment protrudes from the sleeve portion of the foot. When the write head is positioned for attaching another wiring pattern at block 208, the nip roller is released, causing the counterweight 132 to reduce the slack in the slack portion, and the small segment of wire protruding from the foot contacts PSA layer. Taking slack out of the slack portion of the wire permits the payout head to restore a known amount of slack to the wire before commencing laying another segment of wire.

Figure 3:
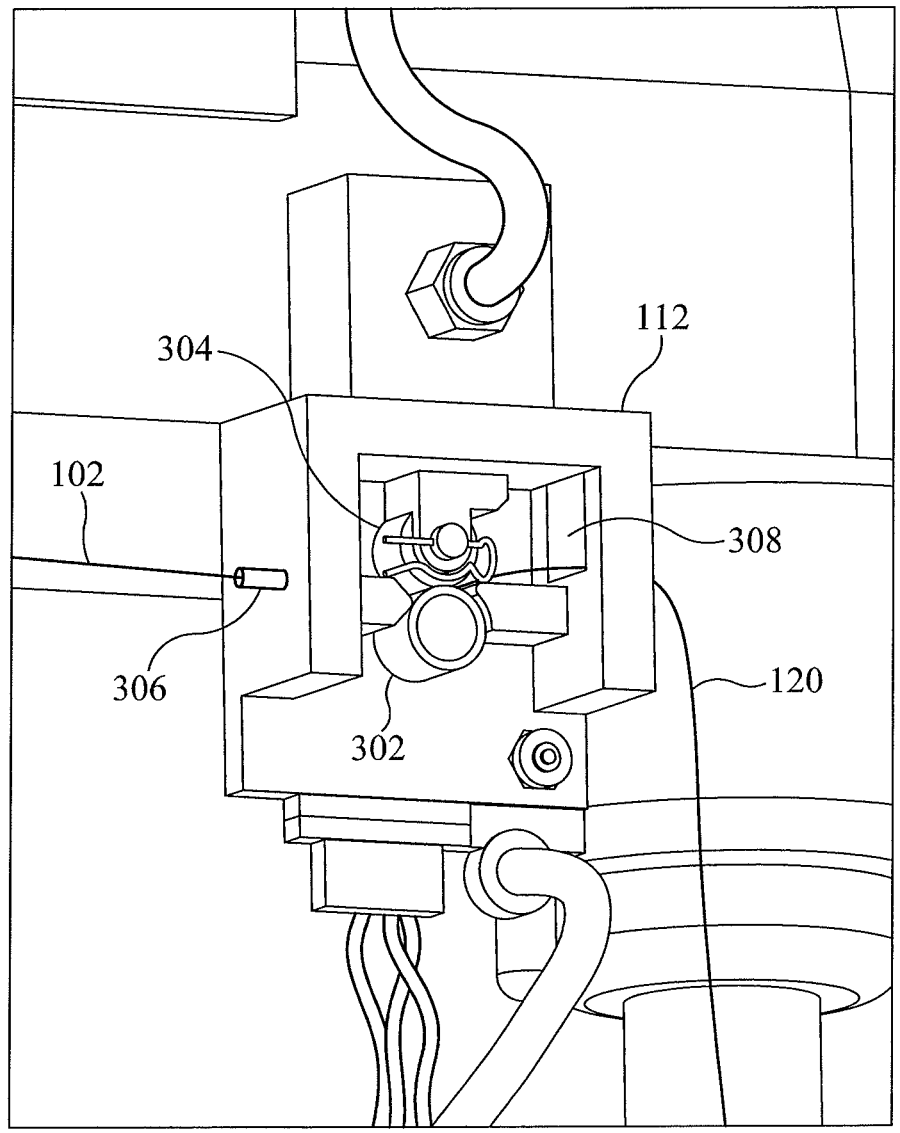
FIG. 3 shows a perspective view of the payout head.

FIG. 3 shows a perspective view of the payout head 112. Nip rollers 302 and 304 draw wire 102 through inlet tube 306 and force the wire out through opening 308 creating slack portion 120. Roller 302 may be driven by a servo motor or stepper motor, and roller 304 freely rotates, with the position of roller 304 being pneumatically controlled to force roller 304 to contact roller 302 to draw wire through the payout head when a wire pattern is being attached to the PSA and substrate. Roller 304 is moved away from roller 302 to disengage roller 304 from contacting roller 302 when a wiring pattern is not being attached to the PSA and substrate.

Figure 4:
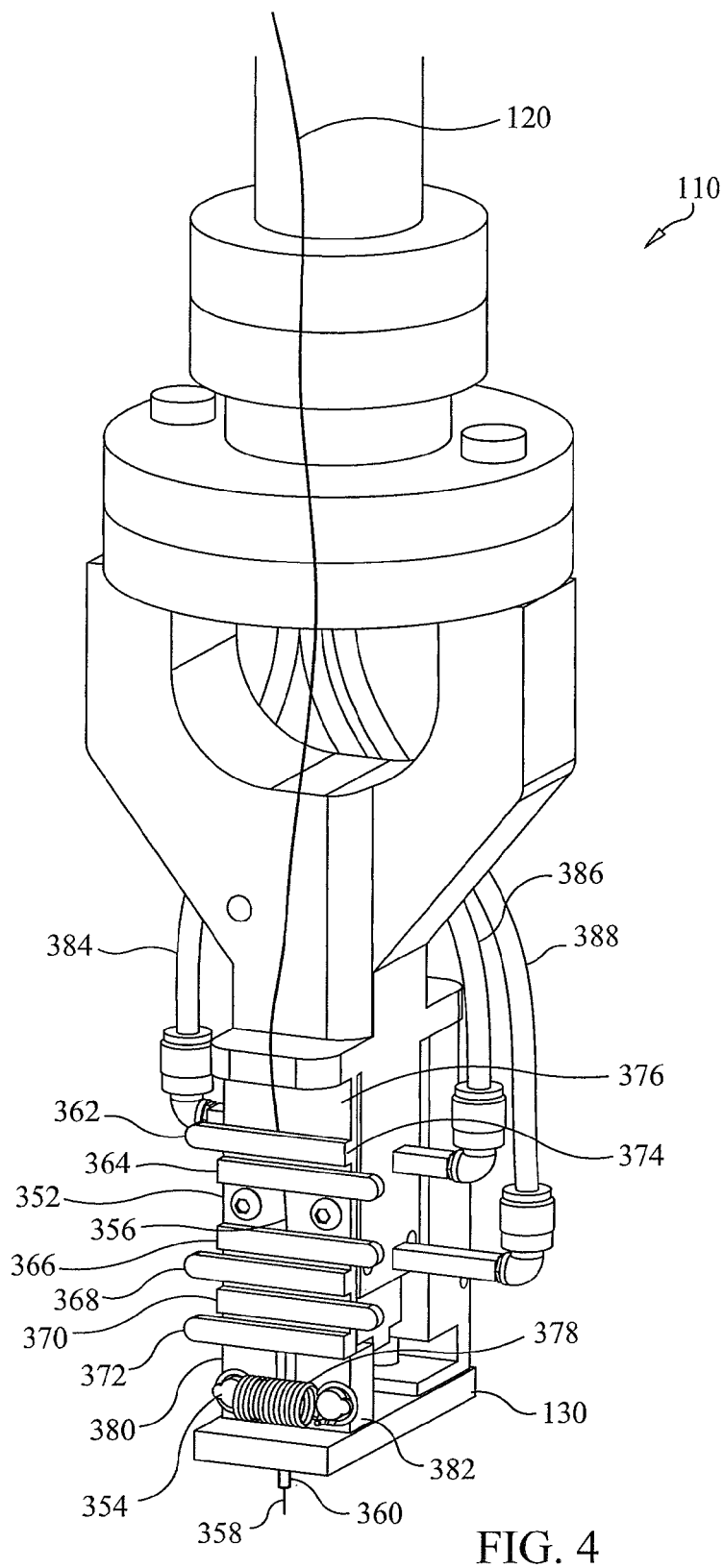
FIG. 4 shows a perspective view of the write head.

FIG. 4 shows a perspective view of the write head 110. The slack portion 120 of the wire is guided along the write head by wire guide 352, through clamp 354, and through foot 130. Segments 356 and 358 of the wire can be seen passing through the wire guide 352 and exiting sleeve 360, respectively. The wire guide 352 has alternating finger elements 362, 364, 366, 368, 370, and 372. The finger elements alternate, for example, in that each finger element (e.g., 362) has a base portion attached at one side 374 of the wire guide, and the base portion of the adjacent finger element (e.g., 364) is attached at the other side of the wire guide. The wire passes through the wire guide between the finger elements and surface 376 of the wire guide. The alternating finger elements allow the fine gauge wire to be easily threaded through the wire guide to prepare the robot for attaching wire patterns. In addition to guiding the wire to the clamp 354, the wire guide alleviates memory in the wire from the spool and payout head.

The clamp 354 includes coil spring 378 and support members 380 and 382. One end of the coil spring is attached to support member 380, and the other end of the coil spring is attached to support member 382. The support members are pneumatically actuated, such as through pneumatic supply tube 384, to clamp and unclamp the segment of the wire that passes between coils of the spring. The wire is unclamped by pneumatic pressure forcing the support members apart, stretching the coil spring. The wire is clamped by releasing the pneumatic pressure, allowing the coil spring to retract, which squeezes the wire between adjacent coils of the spring. The spring clamp prevents kinking of wire when clamping.

Pneumatic supply tubes 386 and 388 allow the foot 130 to be lowered and raised relative to the clamp 354 and other portions of the write head. The lowering and raising of the foot is used in breaking the wire when a wiring pattern is complete, as will be shown in FIGS. 9 and 10.

Figure 5:
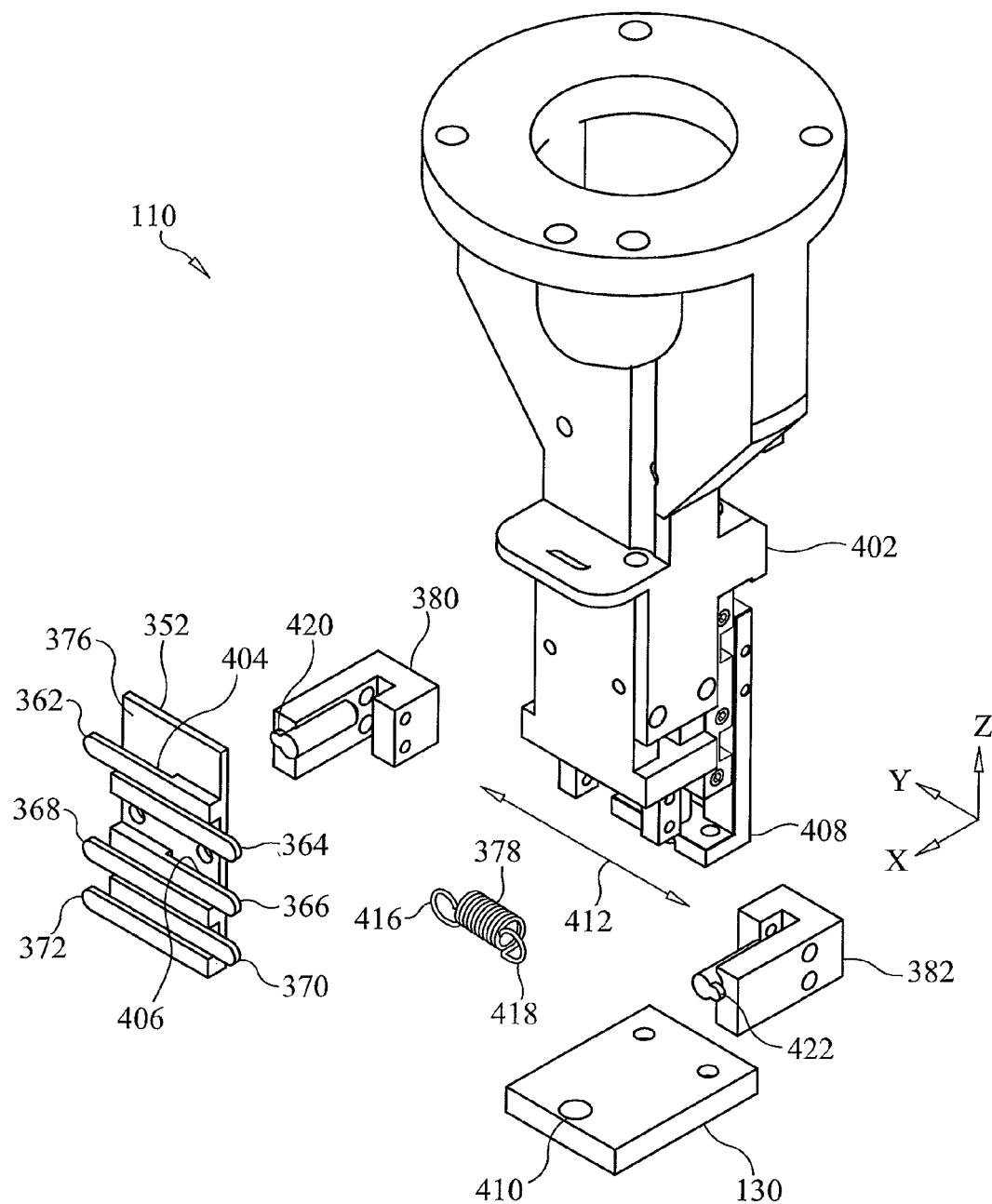
FIG. 5 shows an exploded view of the write head.

FIG. 5 shows an exploded view of write head 110. The write head includes base 402, foot 130, wire guide 352, support members 380 and 382, and coil spring 378. The wire guide may be fixedly attached to the base. Spaces between the alternating finger elements 362, 364, 366, 368, 370, and 372 and the surface 376 of the wire guide are illustrated by the space 404 between finger element 362 and the surface 376 and the space 406 between finger element 366 and the surface 376.

The foot 130 is attached to plate 408 and includes opening 410 through which the wire (not shown) may pass. The plate 408 and foot 130 are movable about the Z axis relative to the base 402. Movement of the foot along the Z axis is used in breaking the wire after completion of a wiring pattern as described further below.

The support members 380 and 382 are attached to the base 402 in a manner that permits the support members to be pneumatically forced away from the base along the Y-axis 412 and stretch the coil spring 378, and to return toward the base by the force of the spring when pressure is released. Spring ends 416 and 418 are attached to hooks 420 and 422 on the support members, respectively.

Figure 6:
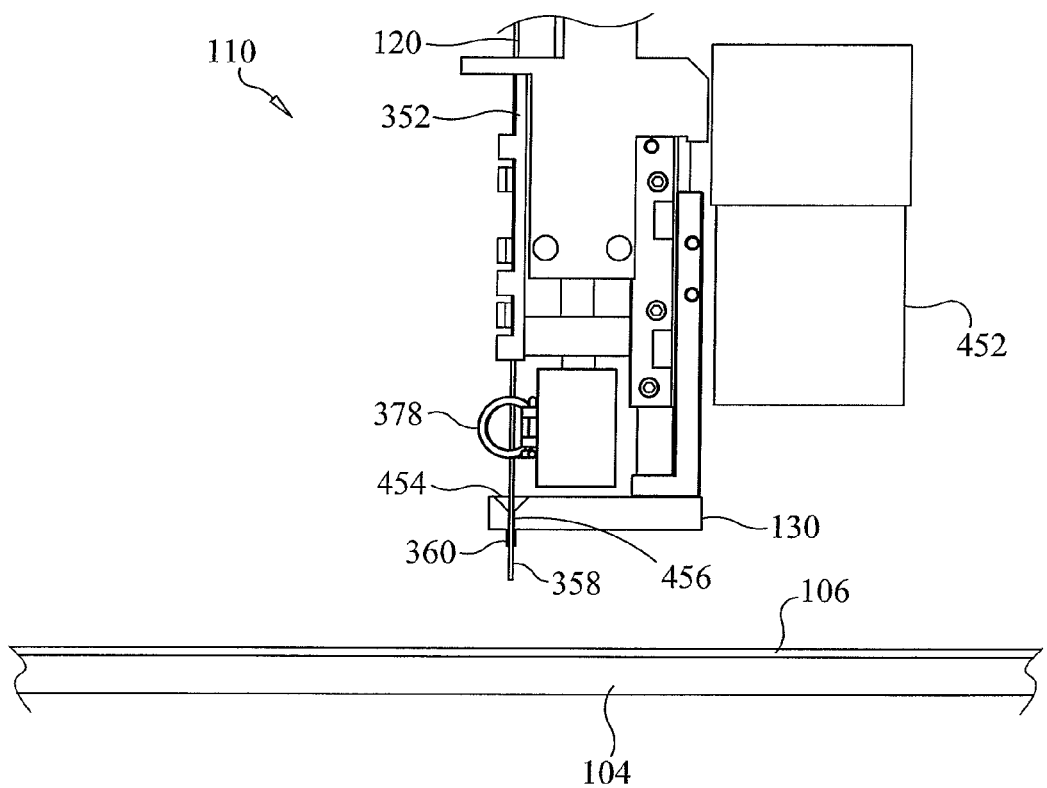
FIG. 6 shows a partial side view of the write head in a position relative to a PSA layer 106 prior to laying of wire on the PSA layer.
Figure 7:
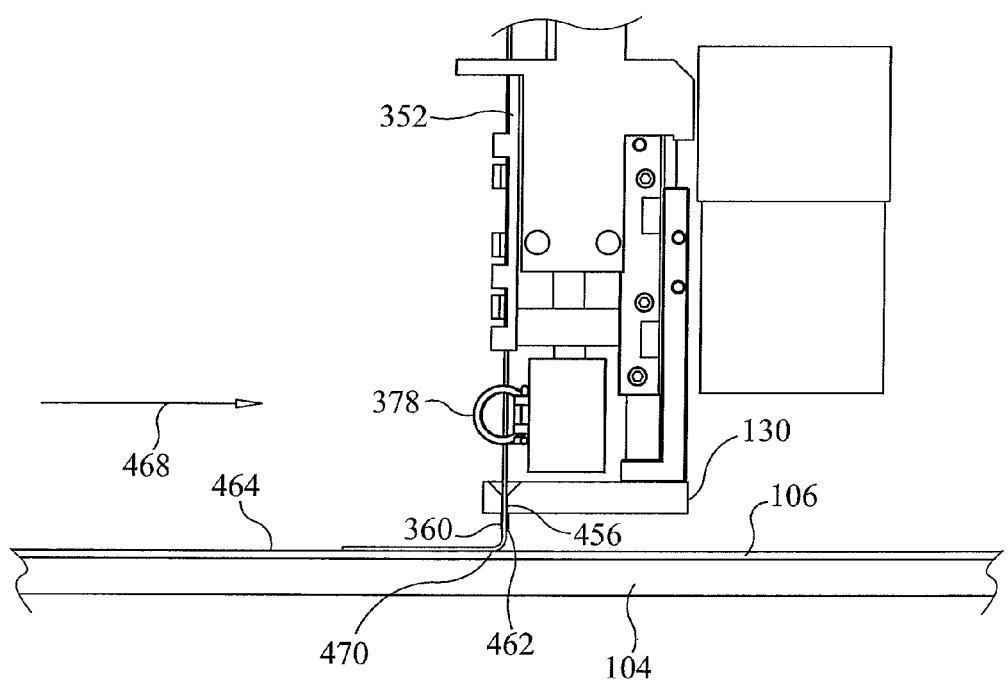
FIG. 7 shows a partial side view of the write head and the position of the write head relative to the PSA layer while laying wire on the PSA layer.

FIGS. 6 and 7 show partial side views of the write head. FIG. 6 shows the write head in a position relative to a PSA layer prior to laying wire on the PSA layer, and FIG. 7 shows the write head relative to the PSA layer while laying wire on the PSA layer.

FIG. 6 shows a partial side view of the write head in a position relative to a PSA layer 106 prior to laying of wire on the PSA layer. The write head 110 may be moved to the desired X and Y coordinates on the substrate 104 based on images gathered by camera 452 and fiducial markers on the substrate.

As the write head is moved to the position at which wire should begin to be attached to the PSA layer, the write head begins a gradual descent toward the substrate and PSA layer. In other words, the robot moves the write head in a continuous motion having horizontal vectors directed to the target X and Y coordinates on the substrate and a vertical vector relative to the exposed surface of the PSA layer. A shallow angle of descent is preferable over a sharp angle of descent in order to create an increased area of contact between the wire and the surface of the PSA and facilitate adhesion of the wire to the PSA for drawing the wire from the slack portion 120 through the wire guide 352. The wire remains clamped by coil spring 378 until the sleeve 360 on the foot 130 is at the desired height above the PSA layer.

A partial cut away view of foot 130 is shown in FIG. 6. The partial cut away shows the wire entering a conical opening 454 in the foot, passing through via 456 in the foot, and exiting from sleeve 360, with segment 358 extending from the bottom of the sleeve. The diameter of via 456 and the inside diameter of sleeve 360 are of a size sufficient to allow the wire to pass without introducing appreciable drag.

FIG. 7 shows a partial side view of the write head and the position of the write head relative to the PSA layer 106 while laying wire on the PSA layer. A small gap is maintained between the exit opening 462 of the sleeve 360 and the surface 464 of the PSA layer 106. The small gap forces the wire segment 470 to contact surface 464 of the PSA layer.

As the write head is moved parallel to the surface of the PSA layer, such as in the direction of arrow 468, the wire adheres to the PSA layer as shown by wire segment 470. The motion of the write head and adherence of the wire to the PSA layer draws wire from the slack portion 120, through the wire guide 352, through the coil spring 378 of the clamp, and through the foot 130.

Figure 10:
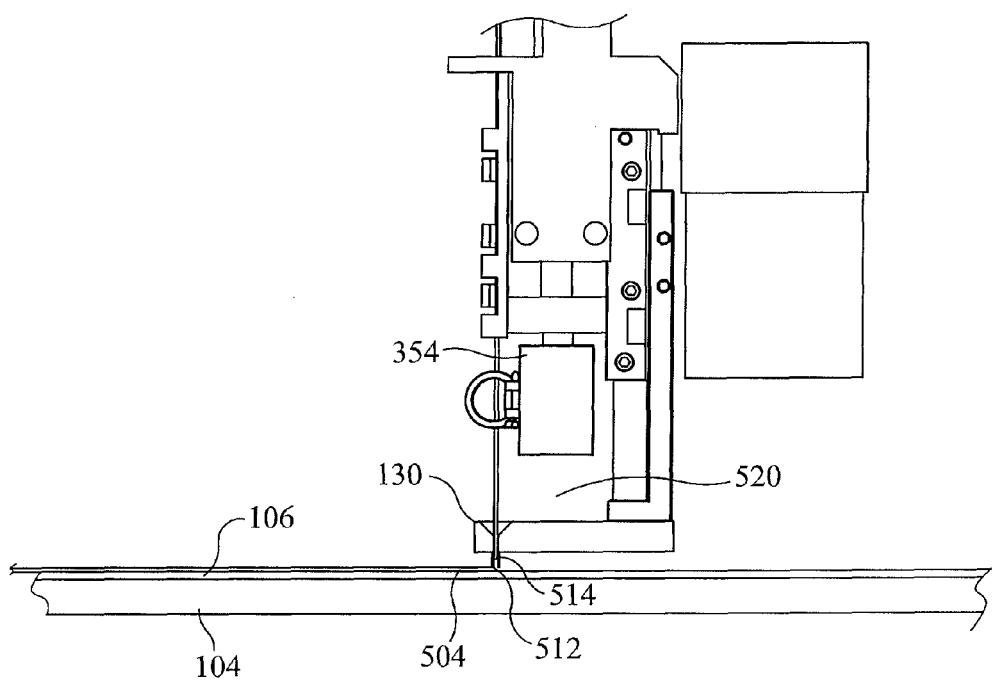
FIG. 10 shows a partial side view of the write head in which the foot of the write head is in contact with the wire on the PSA layer, and the clamp has been raised up and away from the PSA layer.

FIG. 8 shows a bottom perspective view of the write head. In addition to breaking the wire, the sleeve 360 provides separation between the bottom surface 502 of foot 130 and the surface (FIG. 7, #464) of the PSA layer. When breaking the wire after completion of a wiring pattern, edge 504 of the sleeve 360 is pressed against the wire that is on the PSA. FIGS. 9 and 10 show in more detail actions of the write head in breaking the wire. Wire may be laid close to electronic devices (not shown) that are also attached to the PSA layer, with the length of sleeve 360 sufficient to prevent contact between surface 502 (or edges) of the foot 130 and the electronic devices.

When a wiring pattern is complete, movement of the write head 110 parallel to the PSA layer is stopped. After stopping, the write head is raised away from the PSA layer approximately 1 mm. As the write head is raised, the portion of the wire adhered to the PSA remains adhered, and after raising the write head, the wire is clamped in the coil spring 378. The foot of the write head is then lowered to the position shown in FIG. 9. The other parts of the write head remain in the raised position.

FIG. 9 shows a partial side view of the write head and the position of the write head relative to the PSA layer 106 after raising the write head and lowering the foot. The foot of the write head is lowered toward the PSA layer such that the edge 504 of the sleeve contacts the wire 470 at the point where the wire meets the PSA. To break the wire, the foot 130 of the write head is maintained at the height above the PSA shown in FIG. 9, and the clamp 354 and associated components of the write head are raised up and away from the PSA layer.

FIG. 10 shows a partial side view of the write head in which the foot 130 of the write head is in contact with the wire on the PSA layer 106, and the clamp 354 has been raised up and away from the PSA layer. Raising the clamp away from the foot while the edge 504 of the sleeve contacts the wire on the PSA breaks the wire, as shown by wire ends 512 and 514. The raising of the clamp away from the foot may be seen by the increased difference between the gap 518 in FIG. 9 and gap 520 in FIG. 10.

After the wire is broken, the foot is raised away from the PSA layer and toward the clamp. With the foot returned nearer the clamp and the wire clamped, the wire end 514 is forced down through the sleeve 360, and the write head may be moved to the next position for laying another wire pattern.

Though aspects and features may in some cases be described in individual figures, it will be appreciated that features from one figure can be combined with features of another figure even though the combination is not explicitly shown or explicitly described as a combination.

The embodiments are thought to be applicable to a variety of systems for attaching wire to a substrate. Other aspects and embodiments will be apparent to those skilled in the art from consideration of the specification. The embodiments may be implemented as one or more processors configured to execute software, as an application specific integrated circuit (ASIC), or as a logic on a programmable logic device.

It is intended that the specification and illustrated embodiments be considered as examples only, with a true scope of the invention being indicated by the following claims.

What is claimed is:

1. A method of attaching wire to an exposed surface of an adhesive layer, comprising:
   guiding wire from a wire source through a payout head and through a foot of a write head, the foot having a surface facing the adhesive layer and a first portion of the wire extending from the foot toward the adhesive layer;
   positioning the write head such that a gap between the surface of the foot and the exposed surface of the adhesive layer is greater than a diameter of the wire, and the first portion of the wire extends toward the exposed surface of the adhesive layer and contacts a first site of the adhesive layer when positioning is complete;
   moving the write head in a motion parallel to the adhesive layer, wherein the first portion of the wire extending toward the exposed surface of the adhesive layer adheres to the adhesive layer; and
   pulling the wire from the wire source by the payout head as the write head is moving and maintaining slack in a second portion of the wire between the payout head and the write head as the wire is attached to the exposed surface of the adhesive layer.

2. The method of claim 1, wherein the positioning the write head includes moving the write head in a continuous motion having horizontal and vertical vectors relative to the exposed surface of the adhesive layer.

3. The method of claim 2, further comprising:
   guiding the wire from a wire guide attached to the write head through a clamp attached to the write head; and
   feeding the wire from the clamp through an opening in the foot of the write head.

4. The method of claim 3, further comprising:
   clamping the wire with the clamp during the positioning of the write head; and
   releasing the wire from the clamp during the moving of the write head.

5. The method of claim 4, further comprising:
   stopping the moving of the payout head parallel to the adhesive layer;
   raising the write head;
   clamping the wire in the clamp;
   lowering the foot and contacting the foot with the wire on the adhesive layer after clamping the wire; and
   raising the clamp away from the foot while maintaining contact between the foot and wire on the adhesive layer, thereby breaking the wire.

6. The method of claim 5, further comprising:
   after the wire is broken:
      raising the foot toward the clamp, leaving a third portion of the wire extending from the foot;
      positioning the write head such that a gap between the surface of the foot and the exposed surface of the adhesive layer is greater than the diameter of the wire, and the third portion of the wire extending toward the exposed surface of the adhesive layer contacts a second site on the adhesive layer when positioning is complete;
      moving the write head parallel to the second site on the adhesive layer after contacting the third portion of the wire to the adhesive layer; and releasing the wire from the clamp after contacting the third portion of the wire at the second site and while moving the write head.

7. The method of claim 6, wherein:
the clamping includes compressing the wire between loops of a coil spring; and
the releasing of the wire from the clamp includes stretching the coil spring.

8. The method of claim 7, wherein:
the stretching of the coil spring includes applying pneumatic pressure to pull ends of the coil spring; and
the releasing of the wire includes releasing the pneumatic pressure.

9. The method of claim 1, wherein the pulling of the wire includes pulling wire that is 30 gauge or smaller.

10. The method of claim 1, wherein the moving of the write head includes moving the write head in a pattern that forms an antenna.

11. The method of claim 1, wherein the moving of the write head includes moving the write head in a pattern for electrically connecting LEDs.

\* \* \* \* \*